США010345833B2

United States Patent
Habu et al.

(10) Patent No.: US 10,345,833 B2
(45) Date of Patent: Jul. 9, 2019

(54) VOLTAGE-CURRENT CONVERTER AND LOAD DRIVER

(71) Applicant: Mitsubishi Electric Corporation, Tokyo (JP)

(72) Inventors: Yo Habu, Tokyo (JP); Mitsutaka Hano, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/453,747

(22) Filed: Mar. 8, 2017

(65) Prior Publication Data

US 2017/0371363 A1 Dec. 28, 2017

(30) Foreign Application Priority Data

Jun. 28, 2016 (JP) ................. 2016-127559

(51) Int. Cl.
| H03B 1/00 | (2006.01) |
| H03K 3/00 | (2006.01) |
| G05F 1/56 | (2006.01) |
| G05F 3/26 | (2006.01) |
| H03K 17/687 | (2006.01) |
| H05B 33/08 | (2006.01) |

(52) U.S. Cl.
CPC ............. G05F 1/561 (2013.01); G05F 3/26 (2013.01); H03K 17/6872 (2013.01); H05B 33/0809 (2013.01); H05B 33/0812 (2013.01); *Y02B 20/345* (2013.01)

(58) Field of Classification Search
CPC ....... G05F 1/561; G05F 3/26; H05B 33/0809; H03K 17/6872

USPC .......................................................... 327/108
See application file for complete search history.

(56) References Cited

U.S. PATENT DOCUMENTS 5,146,188 A 9/1992 Suwada et al.
5,266,887 A * 11/1993 Smith .................... G05F 1/561
                                                            323/316

(Continued)

FOREIGN PATENT DOCUMENTS

| JP | H4-133113 A | 5/1992 |
| JP | 2002-26666 A | 1/2002 |

(Continued)

OTHER PUBLICATIONS

An Office Action issued by the State Intellectual Property Office of People's Republic of China dated Sep. 4, 2018, which corresponds to Chinese Patent Application No. 201710508382.2 and is related to U.S. Appl. No. 15/453,747.

(Continued)

*Primary Examiner* — Metasebia T Retebo
(74) *Attorney, Agent, or Firm* — Studebaker & Brackett PC

(57) ABSTRACT

A current to be supplied to a load driven by the current is linearly controlled in accordance with a voltage. A voltage-current converter according to the present invention includes a differential amplifier, a first current mirror, and a voltage setting unit. The differential amplifier receives an input voltage from an input terminal and outputs a voltage in accordance with a difference between the input voltage and a threshold voltage. The first current mirror receives the voltage from the differential amplifier and outputs an output current to an output terminal. The voltage setting unit sets the threshold voltage.

8 Claims, 8 Drawing Sheets

(56) References Cited

U.S. PATENT DOCUMENTS

| | | | |
|---|---|---|---|
| 7,168,624 B2 * | 1/2007 | Watanabe | G06K 19/0707 |
| | | | 235/492 |
| 2002/0158590 A1 | 10/2002 | Saito et al. | |
| 2008/0284471 A1 | 11/2008 | Kobayashi | |
| 2009/0230998 A1 | 9/2009 | Hayashi | |
| 2013/0162150 A1 | 6/2013 | Masuda | |

FOREIGN PATENT DOCUMENTS

| | | |
|---|---|---|
| JP | 2008-171070 A | 7/2008 |
| JP | 2008-283110 A | 11/2008 |
| JP | 2009-188773 A | 8/2009 |
| JP | 2012-069826 A | 4/2012 |
| JP | 2012-160287 A | 8/2012 |
| JP | 2013-229217 A | 11/2013 |
| JP | 2014-220455 A | 11/2014 |
| JP | 2016-001617 A | 1/2016 |

OTHER PUBLICATIONS

An Office Action; "Notification of Reasons for Refusal," issued by the Japanese Patent Office dated Apr. 9, 2019, which corresponds to Japanese Patent Application No. 2016-127559 and is related to U.S. Appl. No. 15/453,747; with English Translation.

* cited by examiner

VOLTAGE-CURRENT CONVERTER AND LOAD DRIVER

BACKGROUND OF THE INVENTION

Field of the Invention

The present invention relates to a voltage-current converter, and a load driver including the voltage-current converter for supplying a current to a load and driving the load.

Description of the Background Art

Load drivers for supplying a current to a load and driving the load have been conventionally known. For example, Japanese Patent Laying-Open No. 2008-283110 discloses a light emitting diode (LED) driver for driving an LED. In the LED driver, a current from a constant current source is amplified by a current mirror, and is supplied to the LED.

SUMMARY OF THE INVENTION

In the LED driver disclosed in Japanese Patent Laying-Open No. 2008-283110, the current to be supplied to the current mirror may be adjusted by applying a voltage to a control terminal of a transistor included in the constant current source, using a bias adjustment circuit. In a case where the voltage applied by the bias adjustment circuit is increased, when the voltage reaches an operation voltage of the transistor, the current suddenly starts to flow to the current mirror. Accordingly, in a case where it is difficult to precisely specify the operation voltage of the transistor, it may be difficult to linearly control the current to be supplied to the current mirror in accordance with the voltage. As a result, it may be difficult for the LED driver to control the LED.

The present invention has been made to solve the aforementioned problem, and an object thereof is to facilitate control of a load driven with a current (current load).

A voltage-current converter according to the present invention is connected between a first power source and a ground point, and configured to output an output current from an output terminal in accordance with an input voltage applied to an input terminal. The voltage-current converter includes a differential amplifier, a first current mirror, and a voltage setting unit. The differential amplifier is configured to receive the input voltage from the input terminal and output a voltage in accordance with a difference between the input voltage and a threshold voltage. The first current mirror is configured to receive the voltage from the differential amplifier and output the output current to the output terminal. The voltage setting unit is configured to set the threshold voltage.

With the voltage-current converter according to the present invention, the threshold voltage of the differential amplifier is set to an arbitrary voltage by the voltage setting unit. Accordingly, no current is output when the input voltage is equal to the threshold voltage, and the output current is increased in accordance with an increase in the difference between the input voltage and the threshold voltage. As a result, linearity of the output current with respect to the input voltage is improved, and control of the current load can be easily performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
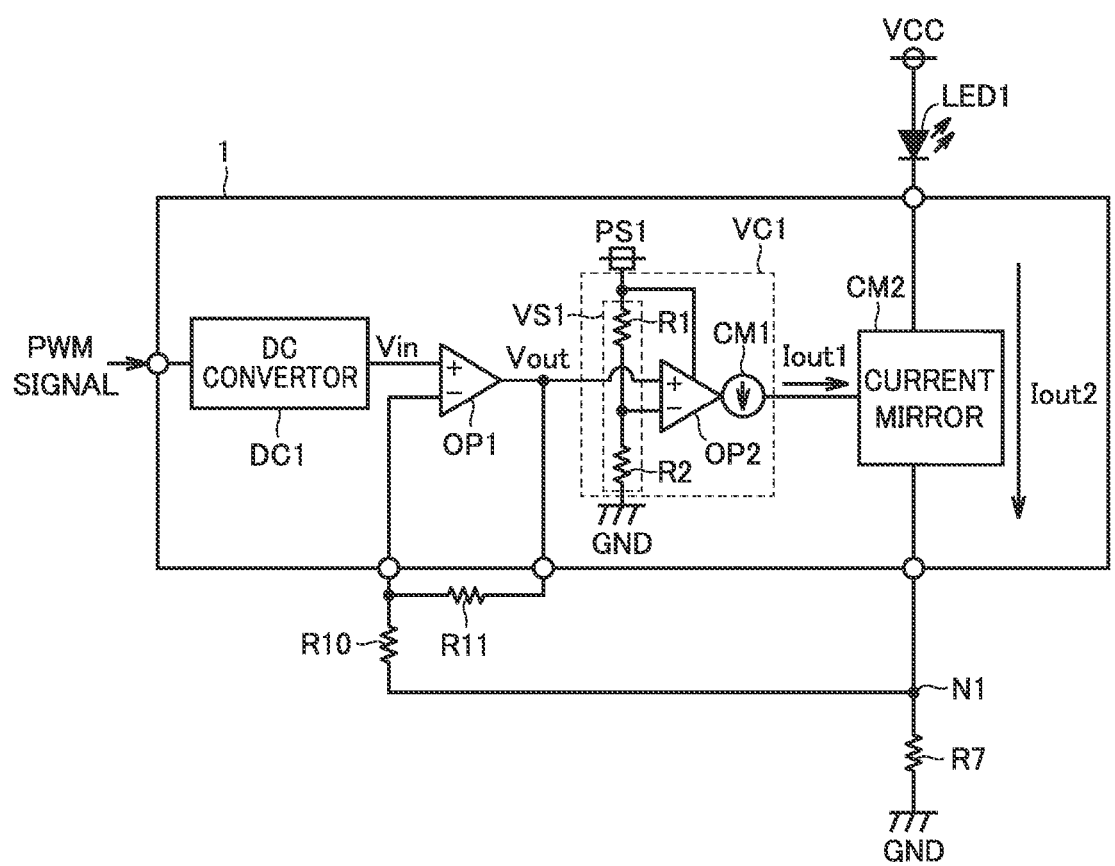
FIG. 1 is a circuit diagram of an LED driver as an example of a load driver according to a first embodiment.

Hereinafter, embodiments of the present invention will be described in detail with reference to the drawings. It should be noted that identical or corresponding parts in the drawings will be designated by the same reference numerals, and the description thereof will not be repeated in principle.

First Embodiment

FIG. 1 is a circuit diagram of an LED driver 1 as an example of a load driver according to a first embodiment. As shown in FIG. 1, a light emitting diode LED1 is a current load which is connected between a power source VCC and a ground point GND, and which emits light in accordance with a current passing therethrough. LED driver 1 is connected between ground point GND and light emitting diode LED1. LED driver 1 receives a pulse width modulation (PWM) signal and controls the current to flow to light emitting diode LED1. LED driver 1 includes a direct current (DC) converter DC1, an operational amplifier OP1 which is a differential amplifier, a voltage-current converter VC1, and a current mirror CM2.

DC converter DC1 receives the PWM signal and converts it into a DC voltage, and outputs a voltage Vin to operational amplifier OP1. Operational amplifier OP1 amplifies voltage Vin and outputs a voltage Vout to voltage-current converter VC1. Voltage-current converter VC1 outputs a current Iout1 in accordance with voltage Vout to current mirror CM2. Current mirror CM2 amplifies current Iout1 to obtain a current Iout2 as the current to flow to light emitting diode LED1.

In order to stabilize current Iout2, resistors R7, R10, and R11 are connected to LED driver 1. Resistor R7 is connected between current mirror CM2 and the ground point. Resistor R10 is connected between an inverted input terminal of operational amplifier OP1 and resistor R7. Resistor R11 is connected between an output terminal of operational amplifier OP1 and resistor R10. When it is defined that a connection node N1 between resistor R7 and resistor R10 has a voltage V11, voltage Vout is expressed by the following equation (1).

$$Vout = (1 + R11/R10)Vin - (R11/R10)R7 \cdot Iout2 \qquad (1)$$

As is clear from the equation (1), when current Iout2 is increased, voltage Vout is decreased, and as a result, current Iout2 is controlled to be decreased. Conversely, when current Iout2 is decreased, voltage Vout is increased, and as a result, current Iout2 is controlled to be increased. Namely, negative feedback control is performed on current Iout2. It should be noted that, when Iout2 is 0, voltage Vout is expressed by the following equation (2).

$$Vout = (1 + R11/R10)Vin \qquad (2)$$

The coefficient (1+R11/R10) of voltage Vin in the equation (2) expresses the amplification factor of operational amplifier OP1.

Figure 2:
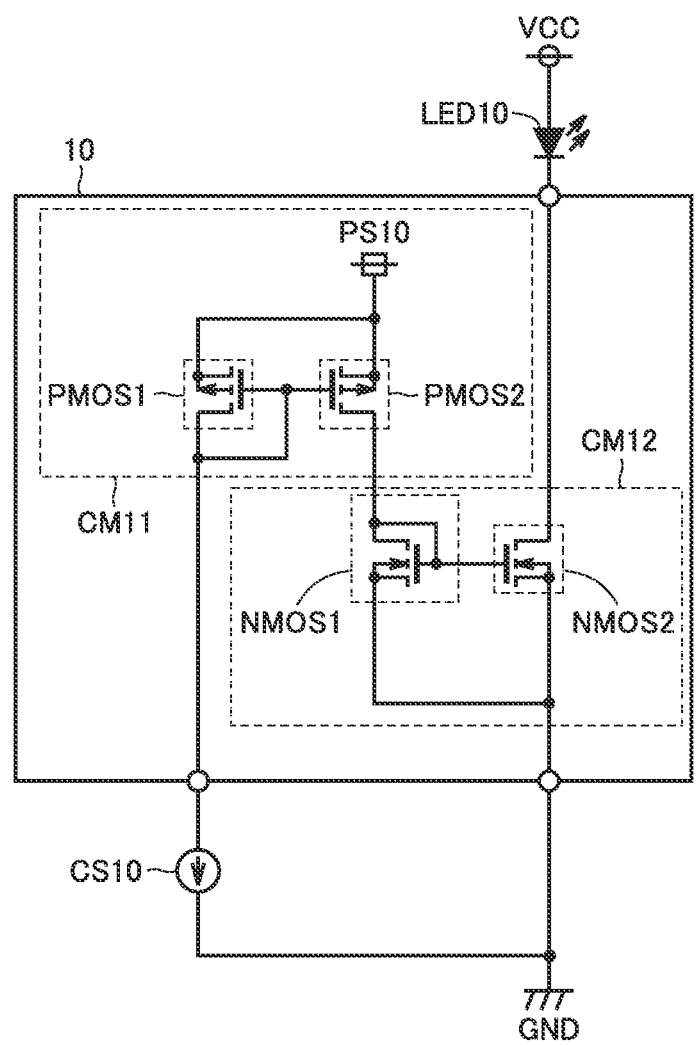
FIG. 2 is a circuit diagram of an LED driver according to a comparative example.

FIG. 2 is a circuit diagram of an LED driver 10 according to a comparative example. As shown in FIG. 2, LED driver 10 includes a current mirror CM11 and a current mirror CM12. A predetermined input current is supplied to current mirror CM11 by a constant current source CS10. Current mirror CM12 receives an output current of current mirror CM11 as an input current, and drives LED10 with a current obtained by amplifying the input current. With such a configuration, LED driver 10 can amplify the input current supplied by constant current source CS10 using current mirrors CM11 and CM12, and send the amplified input current to LED10.

In LED driver 10, the current to be supplied to the current mirror may be adjusted by applying a voltage to a control terminal of a transistor included in the constant current source, using a bias adjustment circuit. In a case where the voltage applied by the bias adjustment circuit is increased, when the voltage reaches an operation voltage of the transistor, the current suddenly starts to flow to the current mirror. Accordingly, in a case where it is difficult to precisely specify the operation voltage of the transistor, it may be difficult to linearly control the current to be supplied to the current mirror in accordance with the voltage. As a result, it may be difficult for the LED driver to control the LED.

Therefore, in the first embodiment, an operation voltage (threshold voltage) of a transistor is applied to an inverted input terminal of an operational amplifier OP2. With such a configuration, current Iout1 is set to 0 when voltage Vout is equal to the threshold voltage, and current Iout1 changes in accordance with a difference between voltage Vout and the threshold voltage. Namely, linearity of current Iout1 with respect to voltage Vout is improved. As a result, linearity of current Iout2 with respect to voltage Vout is also improved, and control of light emitting diode LED1 can be facilitated.

Figure 3:
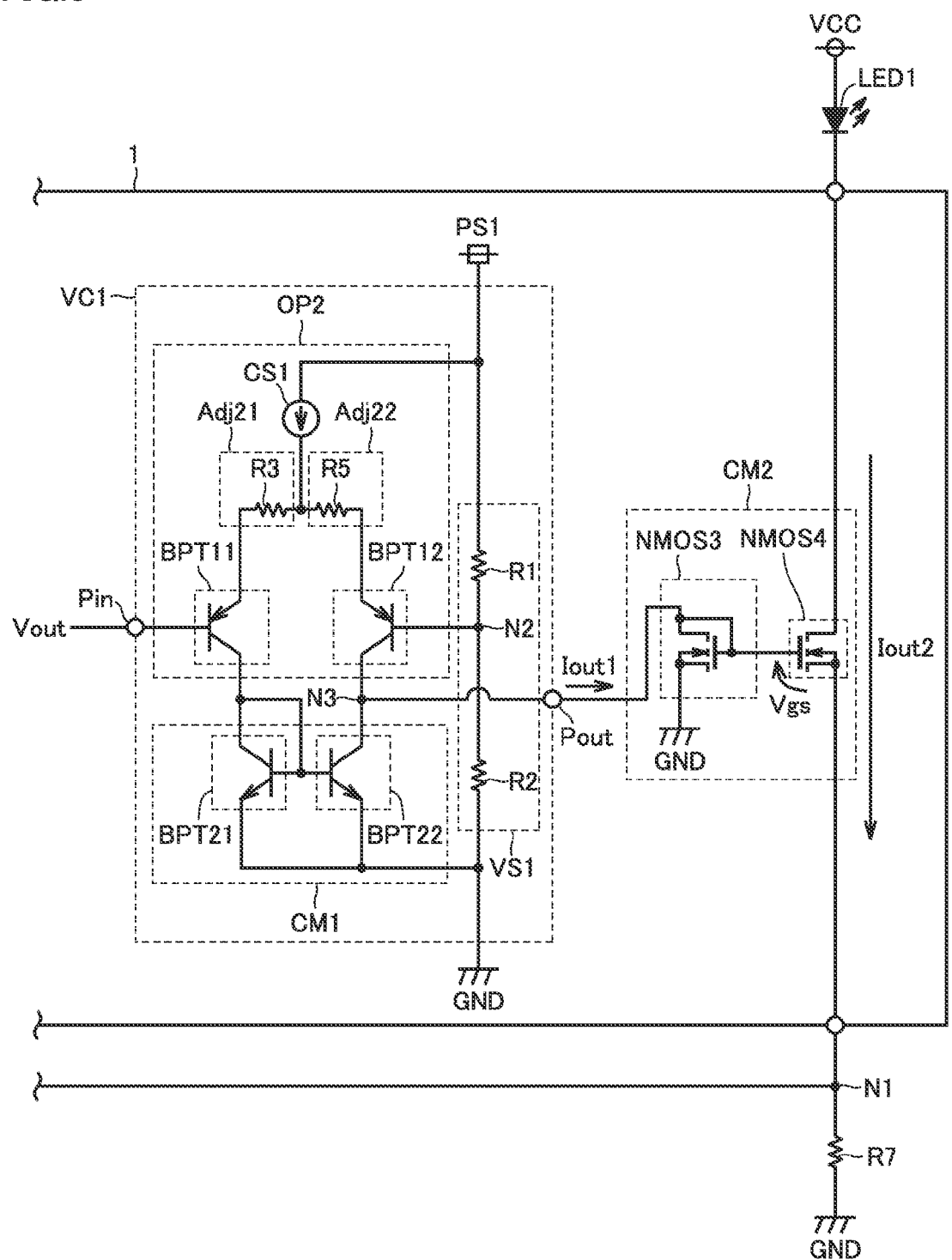
FIG. 3 is a view collectively showing a circuit configuration of a voltage-current converter and a circuit configuration of a current mirror in the first embodiment.

FIG. 3 is a view collectively showing a circuit configuration of voltage-current converter VC1 and a circuit configuration of current mirror CM2 in the first embodiment. As shown in FIG. 3, voltage-current converter VC1 is connected between a power source PS1 and ground point GND. Voltage-current converter VC1 is configured to output current Iout1 from an output terminal Pout in accordance with voltage Vout applied to an input terminal Pin. Voltage-current converter VC1 includes operational amplifier OP2, a current mirror CM1, a voltage setting unit VS1, and resistors R3 and R5.

Operational amplifier OP2 includes a constant current source CS1 connected to power source PS1, PNP type transistors BPT11 and BPT12, an adjustment unit Adj21 including resistor R3, and an adjustment unit Adj22 including resistor R5 having a resistance value equal to that of resistor R3.

Current mirror CM1 includes an NPN type transistor BPT21 connected to transistor BPT11, and an NPN type transistor BPT22 connected to transistor BPT12.

Voltage setting unit VS1 includes resistors R1 and R2. Resistors R1 and R2 are connected in series between power source PS1 and ground point GND.

Each of transistor BPT11, transistor BPT12, transistor BPT21, and transistor BPT22 has a base as a control terminal, an emitter, and a collector. The base of transistor BPT11 is connected to input terminal Pin. The emitter of transistor BPT11 is connected to constant current source CS1 via adjustment unit Adj21. The collector of transistor BPT11 is connected to the collector of transistor BPT21.

The base of transistor BPT21 is connected to the base of transistor BPT22 and the collector of transistor BPT21. The emitter of transistor BPT21 is connected to ground point GND.

The base of transistor BPT12 is connected to a connection node N2 between resistors R1 and R2. A voltage of the base of transistor BPT12 is set by resistors R1 and R2 to be equal to an operation voltage of transistor BPT12. The emitter of transistor BPT12 is connected to constant current source CS1 via adjustment unit Adj22. The collector of transistor BPT12 is connected to the collector of transistor BPT22.

The emitter of transistor BPT22 is connected to ground point GND.

Output terminal Pout is connected to a connection node N3 between the collector of transistor BPT12 and the collector of transistor BPT22.

In voltage-current converter VC1, the base of transistor BPT11 and the base of transistor BPT12 serve as two input terminals of operational amplifier OP2. In operational amplifier OP2, a voltage difference between the two input terminals is amplified and output as a voltage of the collector of transistor BPT11. Since the voltage of the base of transistor BPT12 is set by resistors R1 and R2 to be equal to the operation voltage (threshold voltage) of transistor BPT12, the voltage of the collector of transistor BPT11 is increased in accordance with the difference between voltage Vout and the threshold voltage, by setting voltage Vout to be applied to transistor BPT11 to more than or equal to the threshold voltage. The collector of transistor BPT11 is connected to the collector of transistor BPT21. The collector of transistor BPT21 is connected to the base of transistor BPT21 and the base of transistor BPT22. Accordingly, when the voltage of the collector of transistor BPT11 is increased, voltages of the base of transistor BPT21 and the base of transistor BPT22 are increased, and when the voltages reach the operation voltage, a current flows to transistor BPT21 and transistor BPT22. When the current flows to transistor BPT22, current Iout1 is output from output terminal Pout connected to connection node N3 between the collector of transistor BPT12 and the collector of transistor BPT22.

With voltage-current converter VC1, current Iout1 in accordance with the voltage difference between the two input terminals of operational amplifier OP2 is output. Namely, current Iout1 is not output when voltage Vout is equal to the threshold voltage, and current Iout1 is increased with an increase in voltage Vout. As a result, linearity of current Iout2 with respect to voltage Vout is improved, and control of light emitting diode LED1 can be easily performed.

Further, adjustment units Adj21 and Adj22 adjust a conversion coefficient between voltage Vout and current Iout2.

When a ratio (conversion coefficient) between voltage Vout and current Iout1 is defined as k1, current Iout1 can be expressed by an equation (3).

$$Iout1 = k1 \cdot Vout \qquad (3)$$

When a current mirror ratio, which is a ratio between currents Iout1 and Iout2, is defined as k2, current Iout2 can be expressed by an equation (4).

$$Iout2 = k2 \cdot Iout1 \qquad (4)$$

By substituting the equation (3) for current Iout1 in the equation (4), current Iout2 can be expressed by an equation (5) using voltage Vout. In the equation (5), k3=k2·k1, where a conversion coefficient k3 is a ratio (conversion coefficient) between voltage Vout and current Iout2.

$$Iout2 = k2 \cdot k1 \cdot Vout = k3 \cdot Vout \qquad (5)$$

Based on the equation (5), conversion coefficient k3 can be expressed by an equation (6). When the resistance values of resistors R3 and R5 are increased, a current flowing through operational amplifier OP2 is decreased. Current Iout1 is decreased, and current Iout2 is decreased. As a result, conversion coefficient k3 is decreased, based on the equation (6). Conversely, when the resistance values of resistors R3 and R5 are decreased, the current flowing through operational amplifier OP2 is increased. Current Iout1 is increased, and current Iout2 is increased. As a result, conversion coefficient k3 is increased, based on the equation (6). Thus, conversion coefficient k3 can be adjusted by changing the values of resistors R3 and R5.

$$k3 = Iout2/Vout \qquad (6)$$

Current mirror CM2 receives current Iout1 output from voltage-current converter VC1, and amplifies current Iout1 to obtain current Iout2 as a current to flow to light emitting diode LED1. Current mirror CM2 includes a transistor n-channel metal oxide semiconductor (NMOS)3 and a transistor NMOS4. Each of transistor NMOS3 and transistor NMOS4 has a gate, a source, and a drain. The gate of transistor NMOS3 is connected to the gate of transistor NMOS4 and the drain of transistor NMOS3. The source of transistor NMOS3 is connected to ground point GND. The drain of transistor NMOS3 is connected to output terminal Pout of voltage-current converter VC1. The source of transistor NMOS4 is connected to ground point GND via resistor R7. The drain of transistor NMOS4 is connected to power source VCC via light emitting diode LED1.

In the first embodiment, a voltage of the source of transistor NMOS3 to which current Iout1 is input from voltage-current converter VC1 is lower than a voltage of the source of transistor NMOS4 by an amount corresponding to resistor R7. With such a configuration, the range of voltages at which transistor NMOS3 can be operated is wider than that in a case where the source of transistor NMOS3 is connected to the source of transistor NMOS4 and both have the same electric potential. As a result, the range of voltages at which current mirror CM2 can be operated can be widened.

Figure 4:
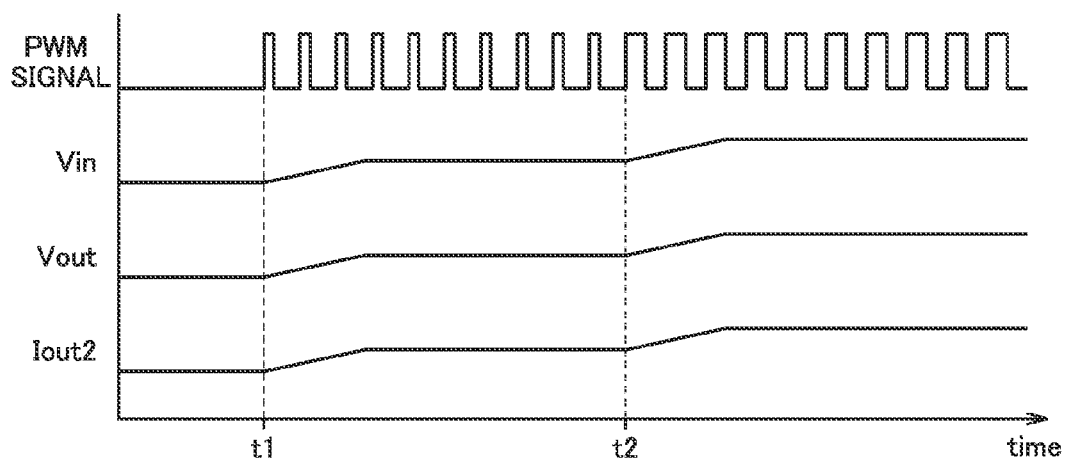
FIG. 4 is a view collectively showing time charts of a PWM signal, a voltage which is an output of a DC converter, a voltage which is an output of an operational amplifier, and a current which flows to a light emitting diode.

FIG. 4 is a view collectively showing time charts of the PWM signal, voltage Vin which is an output of DC converter DC1, voltage Vout which is an output of operational amplifier OP1, and current Iout2 which flows to light emitting diode LED1. As shown in FIG. 4, from time t1, the PWM signal having a certain duty ratio is input, and voltage Vin increases. In accordance with the increase in voltage Vin, voltage Vout increases, and as a result, current Iout2 increases. When the increase in voltage Vin stops, the increase in voltage Vout and the increase in current Iout2 also stop. From time t2, the duty ratio of the PWM signal is increased, and voltage Vin further increases. In accordance with the increase in voltage Vin, voltage Vout increases, and as a result, current Iout2 increases. Thus, current Iout2 which flows to light emitting diode LED1 can be controlled by controlling voltages Vin and Vout by the PWM signal. As a result, control of light emitting diode LED1 can be easily performed.

As described above, with the load driver according to the first embodiment, by providing an operation voltage of a transistor to one of input terminals of a differential amplifier of the voltage-current converter, a current in accordance with a voltage difference between the two input terminals of the differential amplifier is output from an output terminal. As a result, linearity of an output current with respect to an input voltage is improved, and control of a current load can be facilitated.

Further, with the load driver according to the first embodiment, by changing the resistance values included in the adjustment units, the conversion ratio between the input voltage and the output current can be adjusted to a value suitable for the current load. As a result, accuracy of control of the current load can be improved.

Second Embodiment

The first embodiment has described the case where each adjustment unit includes one resistor. The resistance value of a resistor may change depending on the temperature. When the resistance value changes, the conversion coefficient between voltage Vout and current Iout2 changes, and accuracy of control of light emitting diode LED1 may be deteriorated. Thus, a second embodiment will describe a configuration which suppresses such a temperature dependence of the conversion coefficient.

The second embodiment is different from the first embodiment in that each adjustment unit includes a resistor having a positive temperature characteristic and a resistor having a negative temperature characteristic. Other than the above difference, the components in the second embodiment are similar to those in the first embodiment, and thus the description thereof will not be repeated.

Figure 5:
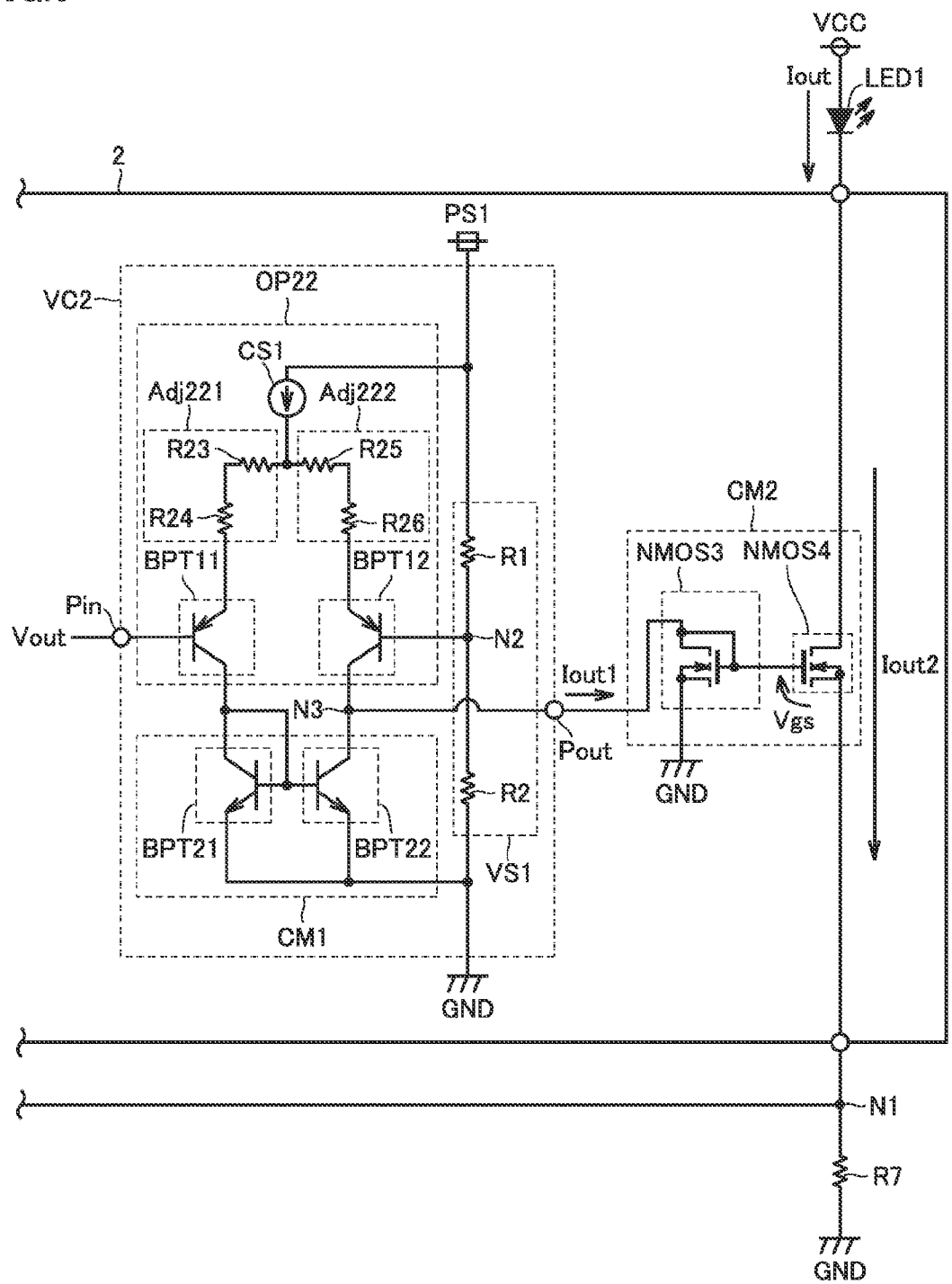
FIG. 5 is a view collectively showing a circuit configuration of a voltage-current converter and the circuit configuration of the current mirror in a second embodiment.

FIG. 5 is a view collectively showing a circuit configuration of a voltage-current converter VC2 and the circuit configuration of current mirror CM2 in the second embodiment. As shown in FIG. 5, an operational amplifier OP22 includes adjustment units Adj221 and Adj222, instead of adjustment units Adj21 and Adj22 of FIG. 1, respectively. Adjustment unit Adj221 includes resistors R23 and R24 connected in series. Adjustment unit Adj222 includes resistors R25 and R26 connected in series. The resistance value of resistor R23 is equal to the resistance value of resistor R25. Resistors R23 and R25 have a positive temperature characteristic. The resistance value of resistor R24 is equal to the resistance value of resistor R26. Resistors R24 and R26 have a negative temperature characteristic.

When the temperature of voltage-current converter VC2 increases, the resistance values of resistors R23 and R25 having a positive temperature characteristic increase, whereas the resistance values of resistors R24 and R26 having a negative temperature characteristic decrease. Conversely, when the temperature of voltage-current converter VC2 decreases, the resistance values of resistors R23 and R25 having a positive temperature characteristic decrease, whereas the resistance values of resistors R24 and R26 having a negative temperature characteristic increase. Accordingly, even when the temperature of voltage-current converter VC2 changes, the resistance value of adjustment unit Adj221 including resistors R23 and R24 and the resistance value of adjustment unit Adj222 including resistors R25 and R26 hardly change. As a result, temperature dependence of the conversion coefficient can be suppressed.

As described above, with a load driver according to the second embodiment, control of a current load can be facilitated and accuracy of control of the current load can be improved, as in the first embodiment.

Further, with the load driver according to the second embodiment, since each adjustment unit includes a resistor having a positive temperature characteristic and a resistor having a negative temperature characteristic, temperature dependence of the conversion coefficient between an input voltage and an output current can be suppressed. As a result, the current load can be stably controlled.

Third Embodiment

The first embodiment has described the case where the voltage of the source of transistor NMOS3 to which current Iout1 is input from voltage-current converter VC1 is lower than the voltage of the source of transistor NMOS4 by the amount corresponding to resistor R7. With such a configuration, the range of voltages at which current mirror CM2 can be operated can be widened, as described above. However, when the voltage of the source of transistor NMOS3 is different from the voltage of the source of transistor NMOS4, a difference occurs between a voltage between the gate and the source of transistor NMOS3 and a voltage between the gate and the source of transistor NMOS4. Further, a difference also occurs between a voltage between the drain and the source of transistor NMOS3 and a voltage between the drain and the source of transistor NMOS4. As a result, accuracy of the current mirror ratio of current mirror CM2 may be deteriorated. Therefore, when the range of voltages at which current mirror CM2 is operated is limited, it is desirable that the source of transistor NMOS3 and the source of transistor NMOS4 have the same electric potential.

Thus, a third embodiment will describe a case where the sources of transistors NMOS3 and NMOS4 included in current mirror CM2 have the same electric potential. With such a configuration, the current mirror ratio of current mirror CM2 can be improved.

The third embodiment is different from the first embodiment in that the sources of transistors NMOS3 and NMOS4 included in current mirror CM2 have the same electric potential. Other than the above difference, the components in the third embodiment are similar to those in the first embodiment, and thus the description thereof will not be repeated.

Figure 6:
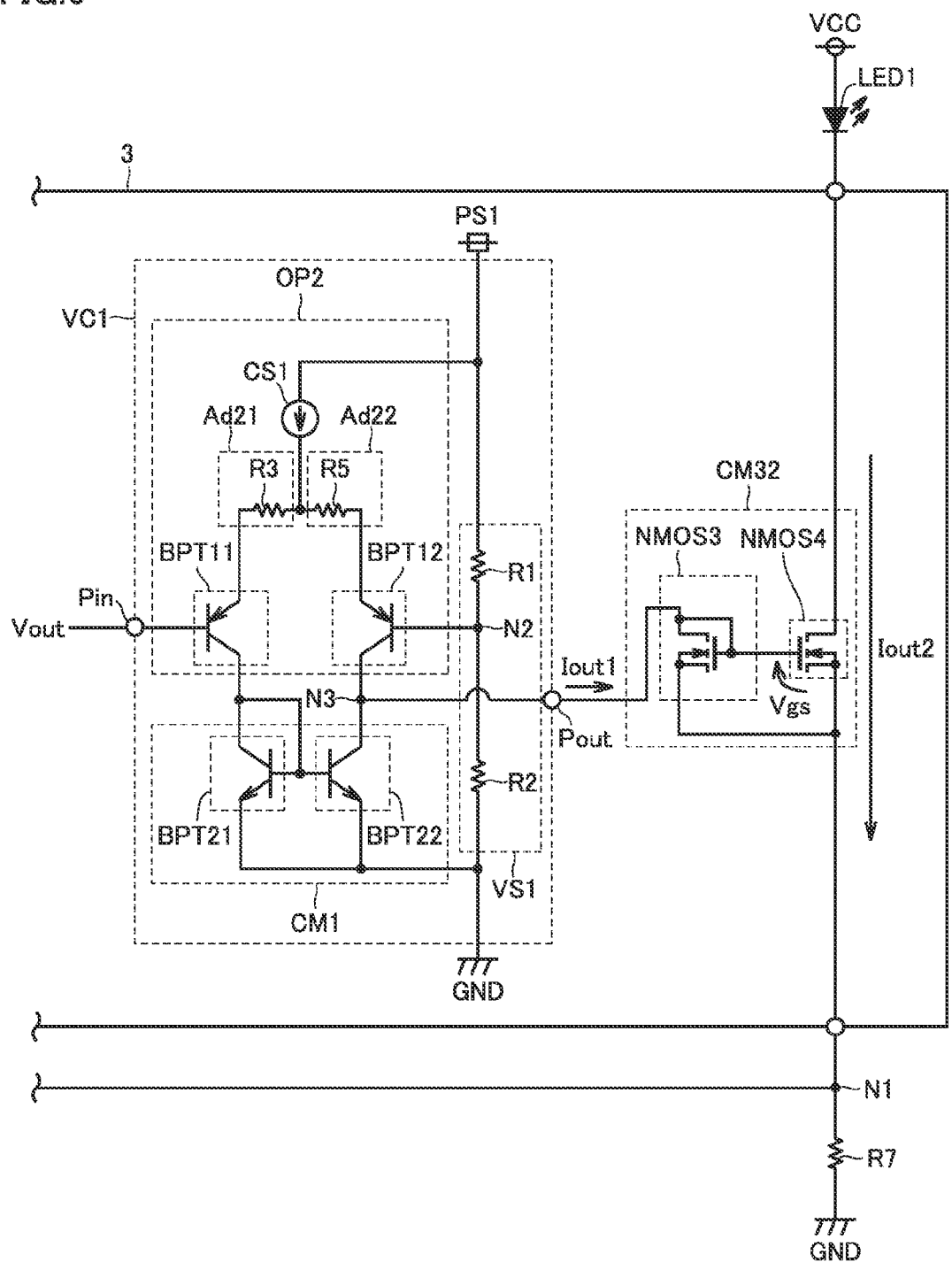
FIG. 6 is a view collectively showing the circuit configuration of the voltage-current converter and a circuit configuration of a current mirror in a third embodiment.

FIG. 6 is a view collectively showing the circuit configuration of voltage-current converter VC1 and a circuit configuration of a current mirror CM32 in the third embodiment. As shown in FIG. 6, the source of transistor NMOS3 included in current mirror CM32 is connected to the source of transistor NMOS4. Thus, by causing the source of transistor NMOS3 and the source of transistor NMOS4 to have the same electric potential, the voltage between the gate and the source of transistor NMOS3 becomes equal to the voltage between the gate and the source of transistor NMOS4, and the voltage between the drain and the source of transistor NMOS3 also becomes equal to the voltage between the drain and the source of transistor NMOS4. As a result, the current mirror ratio of current mirror CM2 can be improved.

As described above, with a load driver according to the third embodiment, control of a current load can be facilitated and accuracy of control of the current load can be improved, as in the first embodiment.

Further, with the load driver according to the third embodiment, the current mirror ratio of the current mirror which receives the current from the voltage-current converter can be improved.

Fourth Embodiment

In LED driver 1 shown in FIG. 1, there may occur a malfunction in which an overcurrent flows to light emitting diode LED1, a malfunction in which a supply voltage decreases, or the like. When light emitting diode LED1 is continued to be driven in such a case, light emitting diode LED1 or LED driver 1 may fail and stop. Thus, a fourth embodiment will describe a load driver including a malfunction detector which detects such a malfunction.

The fourth embodiment is different from the first embodiment in that the malfunction detector is included. Other than the above difference, the components in the fourth embodiment are similar to those in the first embodiment, and thus the description thereof will not be repeated.

Figure 7:
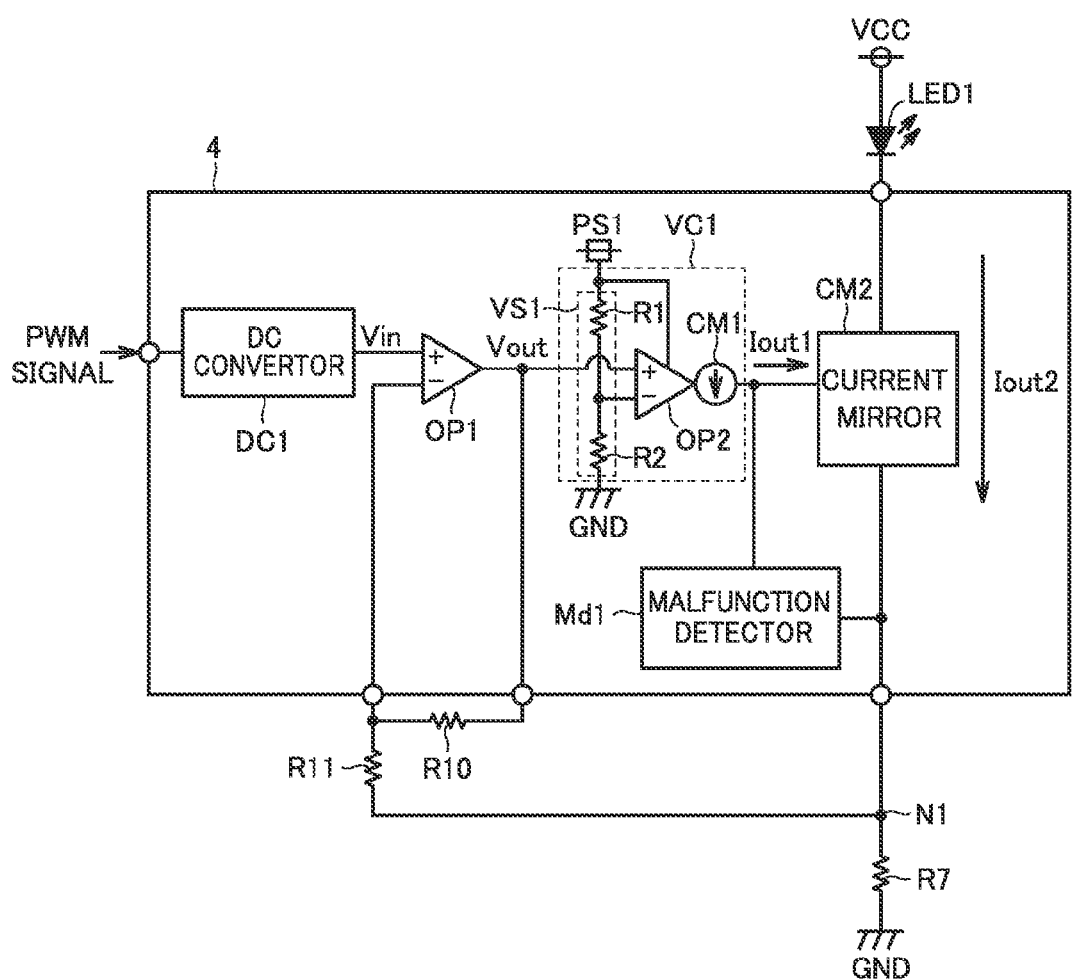
FIG. 7 is a circuit diagram of an LED driver as an example of a load driver according to a fourth embodiment.

FIG. 7 is a circuit diagram of an LED driver 4 as an example of the load driver according to the fourth embodiment. As shown in FIG. 7, LED driver 4 further includes a malfunction detector Md1, in addition to the configuration of LED driver 1 shown in FIG. 1. Malfunction detector Md1 stops an operation of current mirror CM2 when an overcurrent flows to light emitting diode LED1.

Figure 8:
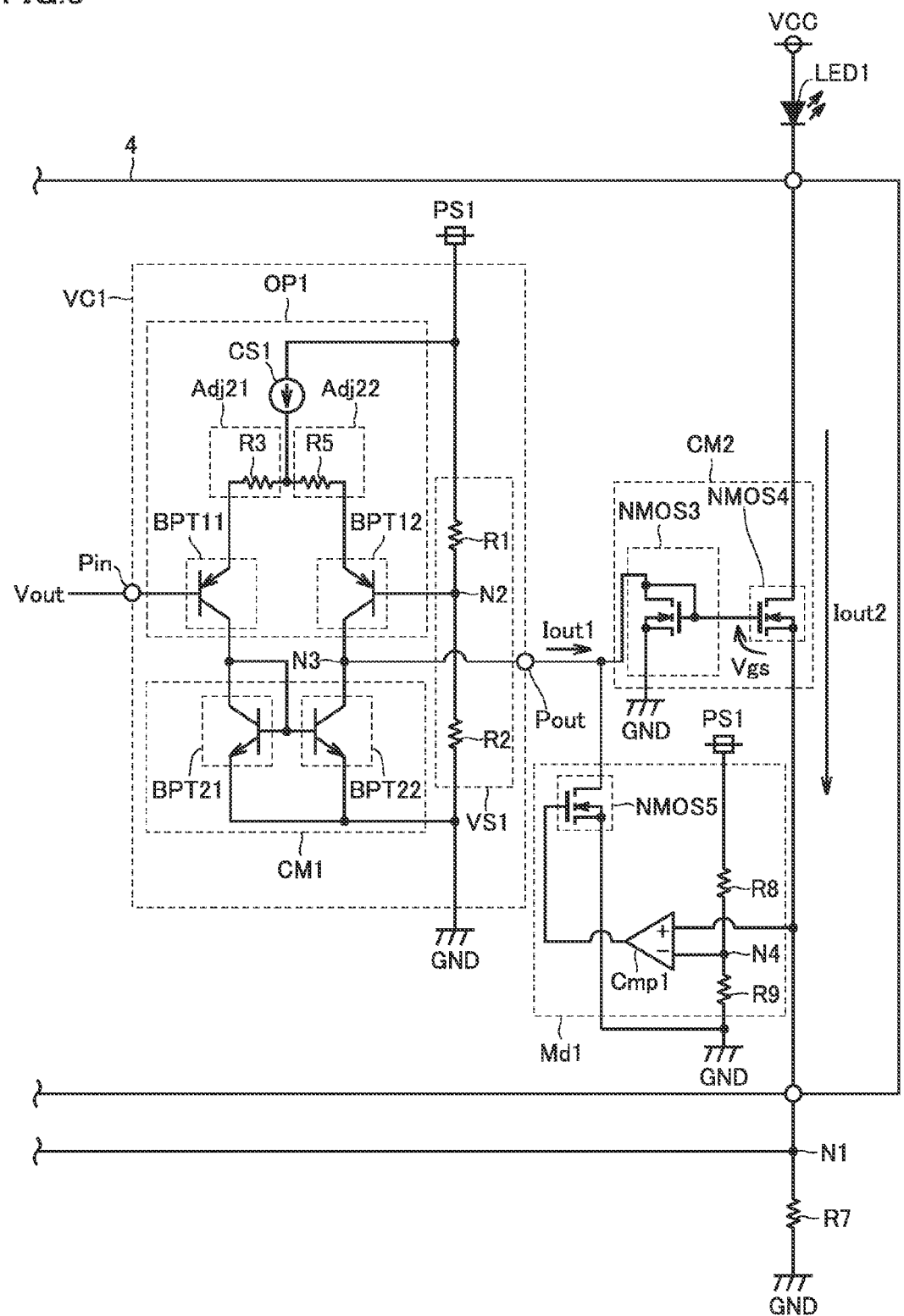
FIG. 8 is a view collectively showing the circuit configuration of the voltage-current converter, the circuit configuration of the current mirror, and a circuit configuration of a malfunction detector in the fourth embodiment.

FIG. 8 is a view collectively showing the circuit configuration of voltage-current converter VC1, the circuit configuration of current mirror CM2, and a circuit configuration of malfunction detector Md1 in the fourth embodiment.

Malfunction detector Md1 includes a comparator Cmp1, a transistor NMOS5, and resistors R8 and R9. Transistor NMOS5 has a gate connected to an output terminal of comparator Cmp1, a source connected to ground point GND, and a drain connected to the drain of transistor NMOS3. Resistors R8 and R9 are connected in series between power source PS1 and ground point GND. Comparator Cmp1 has a non-inverted input terminal connected to the source of transistor NMOS4, and an inverted input terminal connected to a connection node N4 between resistors R8 and R9.

When an overcurrent flows to light emitting diode LED1, a large voltage drop occurs when the overcurrent passes through resistor R7, and the voltage of the source of transistor NMOS4 connected to resistor R7 is increased. Since the non-inverted input terminal of comparator Cmp1 is connected to the source of transistor NMOS4, when the overcurrent flows, a voltage at a High level is output from comparator Cmp1. Since the output terminal of comparator Cmp1 is connected to the gate of transistor NMOS5, when an output voltage of comparator Cmp1 reaches an operation voltage of transistor NMOS5, transistor NMOS5 is brought into conduction. Since the drain of transistor NMOS5 is connected to the drain of transistor NMOS3, when transistor NMOS5 is brought into conduction, the drain of transistor NMOS3 and ground point GND are brought into conduction. As a result, a voltage of the drain of transistor NMOS3 drops. Since the drain of transistor NMOS3 is connected to the gate of transistor NMOS3, when the voltage of the drain of transistor NMOS3 drops, a voltage of the gate of transistor NMOS3 drops. Since the gate of transistor NMOS3 is connected to the gate of transistor NMOS4, when the voltage of the gate of transistor NMOS3 becomes lower than the operation voltage, no current flows to transistors NMOS3 and NMOS4. As a result, current mirror CM2 stops operation.

Current mirror CM2 may be stopped when a supply voltage is detected by the malfunction detector and the supply voltage becomes less than or equal to a predetermined voltage.

As described above, with the load driver according to the fourth embodiment, control of a current load can be facilitated and accuracy of control of the current load can be improved, as in the first embodiment.

Further, with the load driver according to the fourth embodiment, by detecting occurrence of a malfunction by the malfunction detector, the load driver can be stopped immediately after the occurrence of the malfunction. As a result, failure of the load driver or the current load can be prevented.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A voltage-current converter connected between a first power source and a ground point, and configured to output an output current from an output terminal in accordance with an input voltage applied to an input terminal, the voltage-current converter comprising;
   a differential amplifier configured to receive the input voltage from the input terminal and output a voltage in accordance with a difference between the input voltage and a threshold voltage;
   a first current mirror configured to receive the voltage from the differential amplifier and output the output current to the output terminal; and
   a voltage setting unit configured to set the threshold voltage to a fixed voltage that does not vary based on the input voltage, wherein
   the differential amplifier includes a constant current source, a first transistor, and a second transistor, the constant current source being connected to the first power source,
   the first current mirror includes a third transistor connected to the first transistor, and a fourth transistor connected to the second transistor,
   the voltage setting unit includes a first resistor and a second resistor connected in series between the first power source and the ground point,
   each of the first transistor and the second transistor is a first conductivity type transistor,
   each of the third transistor and the fourth transistor is a second conductivity type transistor,
   each of the first transistor, the second transistor, the third transistor, and the fourth transistor has a control terminal, a first terminal, and a second terminal,
   the control terminal of the first transistor is connected to the input terminal,
   the first terminal of the first transistor is connected to the constant current source,
   the second terminal of the first transistor is connected to the second terminal of the third transistor,
   the control terminal of the third transistor is connected to the control terminal of the fourth transistor and the second terminal of the third transistor,
   the first terminal of the third transistor is connected to the ground point,
   the control terminal of the second transistor is connected to a connection node between the first resistor and the second resistor,
   a voltage of the control terminal of the second transistor is set by the first resistor and the second resistor to be equal to an operation voltage of the second transistor,
   the first terminal of the second transistor is connected to the constant current source,
   the second terminal of the second transistor is connected to the second terminal of the fourth transistor,
   the first terminal of the fourth transistor is connected to the ground point, and
   the output terminal is connected to a connection node between the second terminal of the second transistor and the second terminal of the fourth transistor.

2. The voltage-current converter according to claim 1, wherein the differential amplifier further includes a first adjustment unit and a second adjustment unit, the first and second adjustment units being configured to adjust a conversion coefficient between the input voltage and the output current,
   the first adjustment unit is connected between the constant current source and the first terminal of the first transistor,
   the second adjustment unit is connected between the constant current source and the first terminal of the second transistor, and
   a resistance value of the first adjustment unit is equal to a resistance value of the second adjustment unit.

3. The voltage-current converter according to claim 2, wherein
   the first adjustment unit includes a third resistor and a fourth resistor connected in series,
   the second adjustment unit includes a fifth resistor and a sixth resistor connected in series,
   a resistance value of the third resistor is equal to a resistance value of the fifth resistor,
   the third resistor and the fifth resistor have a positive temperature characteristic,
   a resistance value of the fourth resistor is equal to a resistance value of the sixth resistor, and
   the fourth resistor and the sixth resistor have a negative temperature characteristic.

4. The voltage-current converter according to claim 1, wherein
   the voltage setting unit includes a first resistor and a second resistor connected in series between the first power source and the ground point, and
   the threshold voltage is a voltage of a connection node between the first resistor and the second resistor.

5. A load driver for driving a load, comprising:
   a voltage-current converter connected between a first power source and a ground point, and configured to output an output current from an output terminal in accordance with an input voltage applied to an input terminal, the voltage-current converter comprising:
   a differential amplifier configured to receive the input voltage from the input terminal and output a voltage in accordance with a difference between the input voltage and a threshold voltage:
   a first current mirror configured to receive the voltage from the differential amplifier and output the output current to the output terminal: and
   a voltage setting unit configured to set the threshold voltage to a fixed voltage that does not vary based on the input voltage, wherein the differential amplifier includes a constant current source, a first transistor, and a second transistor, the constant current source being connected to the first power source, the first current mirror includes a third transistor connected to the first transistor, and a fourth transistor connected to the second transistor, the voltage setting unit includes a first resistor and a second resistor connected in series between the first power source and the ground point, each of the first transistor and the second transistor is a first conductivity type transistor, each of the third transistor and the fourth transistor is a second conductivity type transistor, each of the first transistor, the second transistor, the third transistor, and the fourth transistor has a control terminal, a first terminal, and a second terminal, the control terminal of the first transistor is connected to the input terminal, the first terminal of the first transistor is connected to the constant current source, the second terminal of the first transistor is connected to the second terminal of the third transistor, the control terminal of the third transistor is connected to the control terminal of the fourth transistor and the second terminal of the third transistor, the first terminal of the third transistor is connected to the ground point, the control terminal of the second transistor is connected to a connection node between the first resistor and the second resistor, a voltage of the control terminal of the second transistor is set by the first resistor and the second resistor to be equal to an operation voltage of the second transistor, the first terminal of the second transistor is connected to the constant current source, the second terminal of the second transistor is connected to the second terminal of the fourth transistor, the first terminal of the fourth transistor is connected to the ground point, and the output terminal is connected to a connection node between the second terminal of the second transistor and the second terminal of the fourth transistor: and a second current mirror including a fifth transistor and a sixth transistor, the load being connected between a second power source and the ground point, each of the fifth transistor and the sixth transistor having a control terminal, a first terminal, and a second terminal, the control terminal of the fifth transistor being connected to the control terminal of the sixth transistor and the second terminal of the fifth transistor, a voltage of the first terminal of the fifth transistor being less than or equal to a voltage of the first terminal of the sixth transistor, the second terminal of the fifth transistor being connected to the output terminal of the voltage-current converter, the first terminal of the sixth transistor being connected to the ground point via a seventh resistor, the second terminal of the sixth transistor being connected to the second power source via the load.

6. The load driver according to claim 5, wherein the first terminal of the fifth transistor is connected to the first terminal of the sixth transistor.

7. The load driver according to claim 5, further comprising a malfunction detector configured to reduce a voltage of the second terminal of the fifth transistor to be less than an operation voltage of the fifth transistor, when a malfunction occurs in the load driver.

8. The load driver according to claim 7, wherein
the malfunction detector includes
a comparator having an inverted input terminal, a non-inverted input terminal, and an output terminal,
a seventh transistor having a control terminal connected to the output terminal of the comparator, a first terminal connected to the ground point, and a second terminal connected to the second terminal of the fifth transistor, and
an eighth resistor and a ninth resistor connected in series between the first power source and the ground point,
the non-inverted input terminal is connected to the first terminal of the sixth transistor, and
the inverted input terminal is connected to a connection node between the eighth resistor and the ninth resistor.

* * * * *